(12) United States Patent
Liu et al.

(10) Patent No.: US 6,555,485 B1
(45) Date of Patent: Apr. 29, 2003

(54) METHOD FOR FABRICATING A GATE DIELECTRIC LAYER

(75) Inventors: Chuan-Hsi Liu, Hsin-Chu (TW); Hsiu-Shan Lin, Taichung (TW); Yu-Yin Lin, Taichung (TW); Tung-Ming Pan, Taipei (TW); Kuo-Tai Huang, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/055,891

(22) Filed: Jan. 28, 2002

(51) Int. Cl.[7] .................. H01L 21/31; H01L 21/469; H01L 21/8234
(52) U.S. Cl. .................. 438/776; 438/762; 438/763; 438/275
(58) Field of Search ................. 438/762, 763, 438/776, 275

(56) References Cited

U.S. PATENT DOCUMENTS 6,268,296 B1 * 7/2001 Misium et al. ............. 438/763
6,331,492 B2 * 12/2001 Misium et al. ............. 438/762
6,342,437 B1 * 1/2002 Moore ........................ 438/474
6,362,085 B1 * 3/2002 Yu et al. ..................... 438/585

\* cited by examiner

Primary Examiner—Alexander Ghyka

(57) ABSTRACT

This invention relates to a method for forming a gate dielectric layer, and, more particularly, to a method for treating a base oxide layer by using a remote plasma nitridation procedure and a thermal annealing treatment in turn to form the gate dielectric layer. The first step of the present invention is to form a base oxide layer on a substrate of a wafer. The base oxide layer can be formed using any kind of method. Then nitrogen ions are introduced into the base oxide layer using the remote plasma nitridation procedure to form a remote plasma nitrided oxide layer. Finally, the wafer is placed in a reaction chamber which comprises oxygen ($O_2$) or nitric monoxide (NO) to treat the remote plasma nitrided oxide layer using the thermal annealing procedure and the gate dielectric layer of the present invention is formed.

9 Claims, 5 Drawing Sheets

METHOD FOR FABRICATING A GATE DIELECTRIC LAYER

BACKGROUND OF THE INVENTION

1. Field of the Invention

This invention relates to a method for forming a gate dielectric layer, and more particularly, to a method for treating an oxide layer by using a remote plasma nitridation procedure and a thermal annealing procedure to improve the channel mobility.

2. Description of the Prior Art

The gate dielectric layer is very important in the metal oxide semiconductor field effect transistor (MOSFET). In order to increase the velocity of the elements and shrink the device dimension, the thickness of the gate dielectric layer will become thinner and thinner. As the thickness of the gate dielectric layer decreases more, the requirement for the gate dielectric layer becomes stricter. A good gate dielectric layer must have lower leakage current (as well as higher breakdown field).

When the thickness of the gate dielectric layer becomes thinner, the electric field across of the gate dielectric layer will be increased for a fixed operating voltage. Therefore, a high-quality dielectric layer is needed. There are some methods in checking the qualities of the gate dielectric layer, such as: (1) time-zero dielectric breakdown (TZDB): sweep the voltage level until the leakage current being higher than a value or detecting a current jump; (2) charge to breakdown: adding all the changes going through the dielectric layer during a constant voltage stress until a current jump occurs; (3)time-dependent dielectric breakdown (TDDB): applying several stress voltages to the devices, measuring the time-to-breakdown, and predicting the device lifetime under normal operation condition.

The traditional method for forming the gate dielectric layer is to use the thermal oxidation procedure to form an oxide layer on the substrate. One recent method now used to form the dielectric layer is to use the remote plasma nitrided oxide layer to be the gate dielectric layer. This method can get a higher dielectric constant for the need of the advanced dielectrics.

Referring to FIG. 1, a diagram for forming an in-situ steam generation (ISSG) oxide layer on the substrate is shown. At first, a wafer, which comprises a substrate 10, is provided. This substrate can be silicon substrate. Then an in-situ steam generation oxide layer 20 is formed on the substrate 10. This in-situ steam generation oxide layer 20 is formed by using the wet oxide procedure.

Referring to FIG. 2, the wafer is then placed into the reaction chamber to proceed a remote plasma nitridation procedure. Nitrogen ions 25 are introduced into the in-situ steam generation oxide layer 20 by using the remote plasma nitridation procedure to become a remote plasma nitrided oxide layer 30 (referring to FIG. 3). This remote plasma nitrided oxide layer 30 is used to be the gate dielectric layer. The nitrogen profiles (i.e., concentration and distribution) can be adjusted depending on the needs of different applications.

Although the remote plasma nitrided oxide layer can get a higher dielectric constant, the channel mobility of the remote plasma nitrided oxide layer is degraded. Therefore, this process will decrease the device performance.

In the current procedure to form the remote plasma nitrided oxide layer using the remote plasma nitridation procedure, the in-situ steam generation oxide layer is formed on the substrate using the wet oxide procedure and is then treated using the remote plasma nitridation procedure to form the remote plasma nitrided oxide layer. Therefore, this procedure will also complicate the process steps and hence decrease the production efficiency of the procedure.

SUMMARY OF THE INVENTION

In accordance with the background of the above-mentioned invention, the known method for forming the remote plasma nitrided oxide layer will decrease the performance and the reliability of the gate dielectric layer and will decrease the production efficiency. The present invention provides a method for treating an oxide layer by using a remote plasma nitridation procedure and a subsequent thermal annealing procedure to form a gate dielectric layer to get better channel mobility.

The second objective of the present invention is to increase the performance of the gate dielectric layer by using a remote plasma nitridation procedure and a thermal annealing procedure in turn to treat the oxide layer to be used as the gate dielectric layer.

The third objective of the present invention is to increase the reliability of the gate dielectric layer by using a remote plasma nitridation procedure and a thermal annealing procedure in turn to treat the oxide layer to be used as the gate dielectric layer.

The fourth objective of the present invention is to increase the qualities of the semiconductor elements by using a remote plasma nitridation procedure and a thermal annealing procedure in turn to treat the oxide layer to be used as the gate dielectric layer.

A further objective of the present invention is to increase the production efficiency of the semiconductor procedure by using a remote plasma nitridation procedure and a thermal annealing procedure in turn to treat the oxide layer to be used as the gate dielectric layer.

In accordance with the foregoing objectives, the present invention provides a method for forming better qualities of the gate dielectric layer by using a remote plasma nitridation procedure and a thermal annealing procedure in turn to treat the oxide layer as used to be the gate dielectric layer. The first step of the present invention is to form a base oxide layer on a substrate of a wafer. The base oxide layer is an oxide layer, which can be formed using any kind of method. Then nitrogen ions are introduced into the base oxide layer using the remote plasma nitridation procedure to form a remote plasma nitrided oxide layer. At last, thermal annealing using oxygen ($O_2$) or nitric monoxide (NO) is applied to the remote plasma nitrided oxide layer to increase the channel mobility and the performance of the gate dielectric layer of the present invention. The present invention can also increase the reliability of the gate dielectric layer and to increase the qualities of the semiconductor elements. The present invention can further increase the production efficiency of the semiconductor procedure.

BRIEF DESCRIPTION OF THE DRAWINGS

In the accompanying drawing forming a material part of this description, the following is illustrated.

DESCRIPTION OF THE PREFERRED EMBODIMENT

Figure 1:
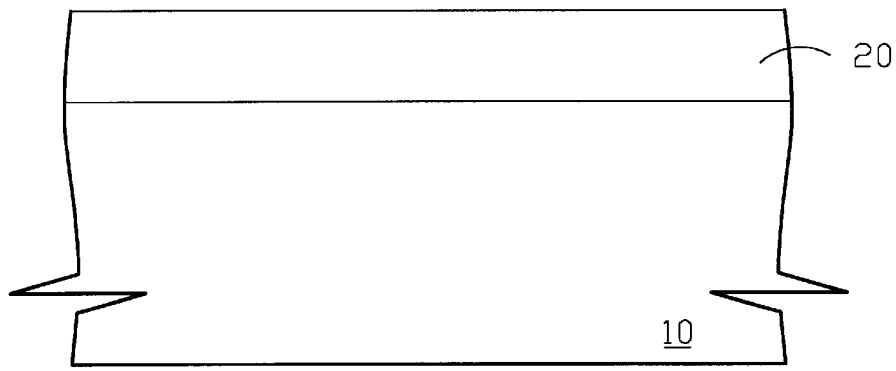
FIG. 1 shows a diagram in forming an in-situ steam generation oxide layer on the substrate.
Figure 2:
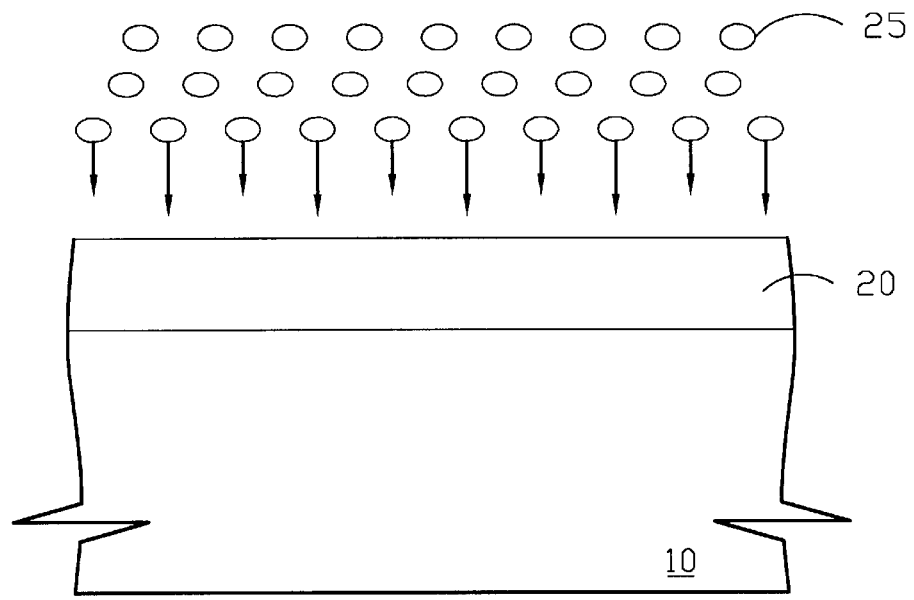
FIG. 2 shows a diagram in placing the wafer into the reaction 15 chamber to start the remote plasma nitridation procedure.
Figure 3:
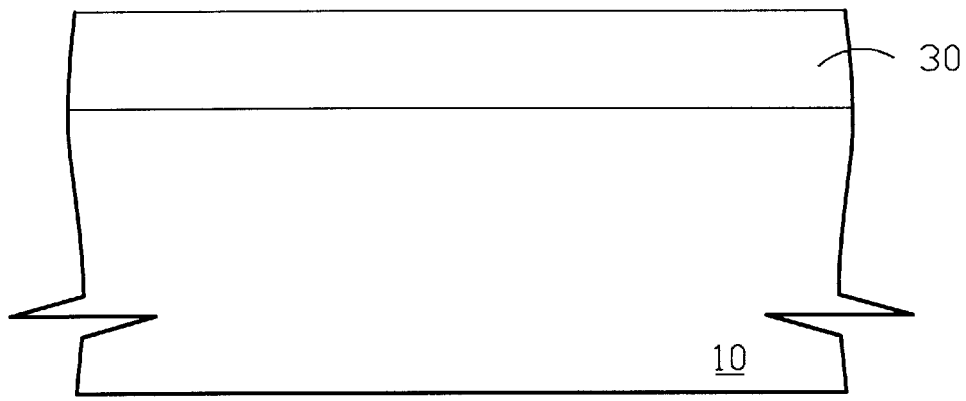
FIG. 3 shows a diagram in forming a remote plasma nitrided oxide layer on the substrate.
Figure 4:
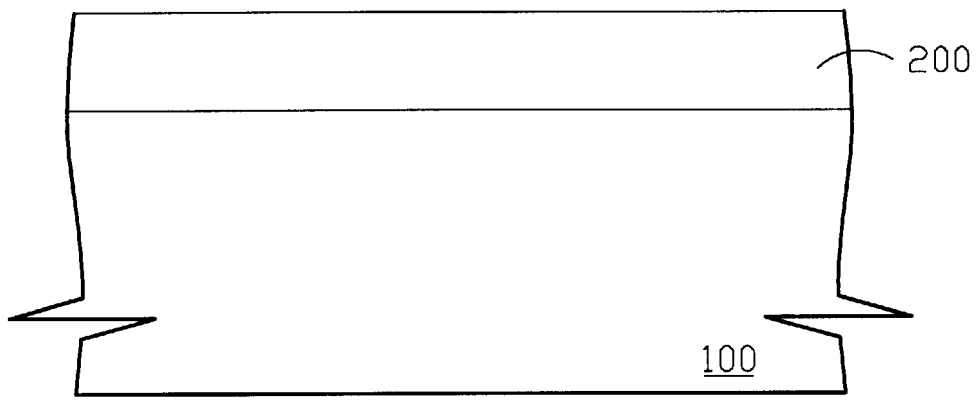
FIG. 4 shows a diagram in forming a base oxide layer on the substrate.

The foregoing aspects and many of the intended advantages of this invention will become more readily appreciated as the same becomes better understood by reference to the following detailed description, when taken in conjunction with the accompanying drawings, wherein:

Referring to FIG. 4, a diagram in forming a base oxide layer on the substrate is shown. At first, a wafer, which comprises a substrate 100, is provided. This substrate can be silicon substrate. Then a base oxide layer 200 is formed on the substrate 100. This base oxide layer 200 can be formed using any kind of procedure which is used to form the oxide layer. The thickness of the base oxide layer is dependent on the needs of the semiconductor products.

Figure 5:
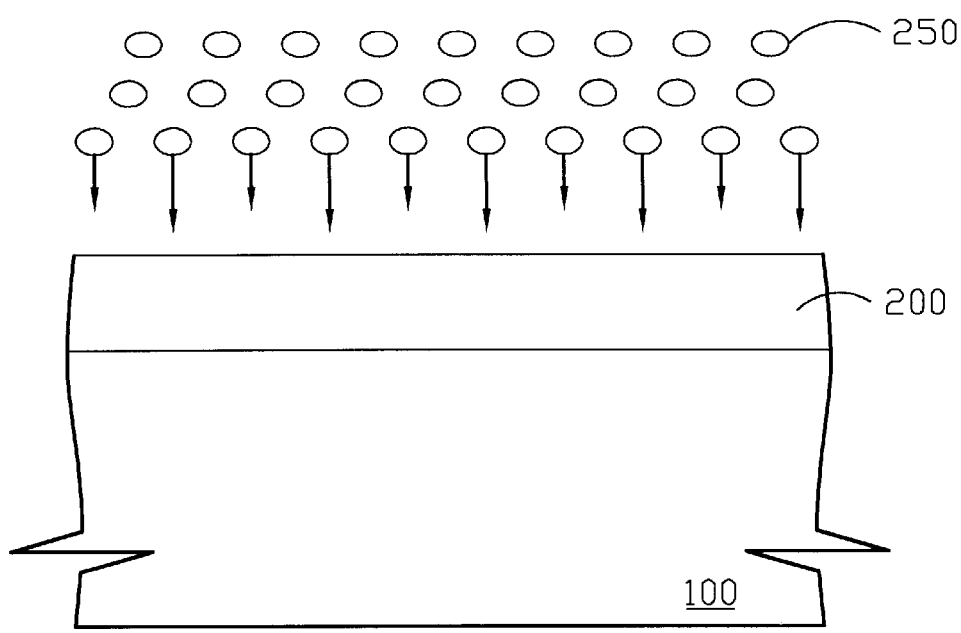
FIG. 5 shows a diagram in placing the wafer into the reaction chamber to start the remote plasma nitridation procedure.
Figure 6:
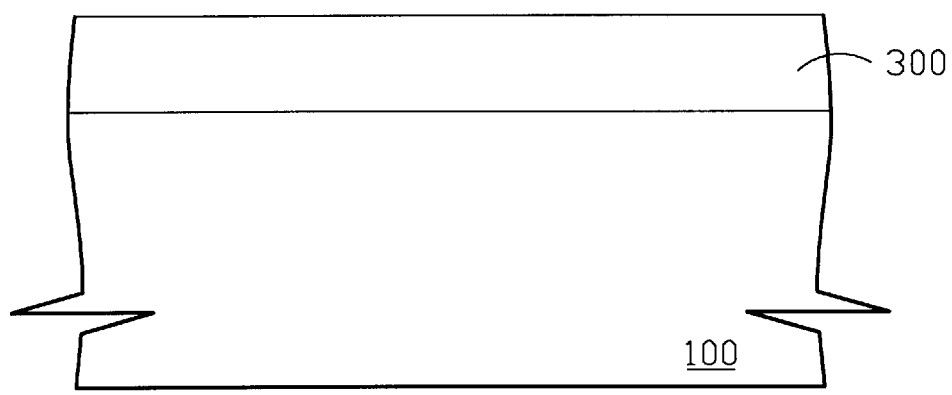
FIG. 6 shows a diagram for forming a remote plasma nitrided oxide layer on the substrate.

Referring to FIG. 5, the wafer is then placed into the reaction chamber to proceed a remote plasma nitridation procedure. Nitrogen ions are incorporated into the base oxide layer 200 using the remote plasma nitridation procedure to become a remote plasma nitrided oxide layer 300 (referring to FIG. 6). This remote plasma nitrided oxide layer 300 is used as the gate dielectric layer. The nitrogen profile (including distribution and concentration) can be adjusted according to the needs of the semiconductor products. The temperature of the remote plasma nitridation procedure ranges from 450 to 900° C. The best temperature of the remote plasma nitridation procedure ranges from 500° C. The pressure of the remote plasma nitridation procedure is about 1 to 2.2 torrs. The best pressure of the remote plasma nitridation procedure is about 1.3 torrs. The processing time of the remote plasma nitridation procedure ranges from 40 to 120 seconds. The best processing time of the remote plasma nitridation procedure is about 70 seconds. In the remote plasma nitridation procedure, the gas in the chamber is not all nitrogen. The gas also comprises 50% to 90% carrier gas. In the best condition, the gas comprises 76% carrier gas to proceed the remote plasma nitridation procedure. In general, helium (He) is usually used as the carrier gas.

Figure 7:
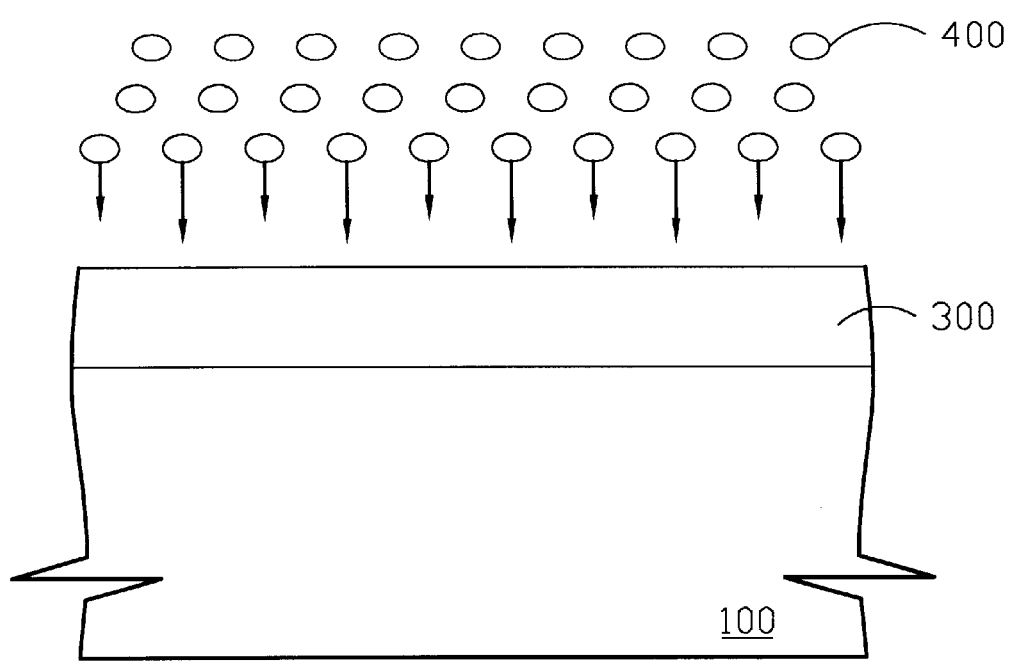
FIG. 7 shows a diagram for treating the remote plasma nitrided oxide layer, which is on the substrate, by using a gas thermal annealing procedure.

Referring to FIG. 7, then the wafer is placed into a chamber to proceed a thermal annealing procedure. Gas 400, which comprises oxygen or nitric monoxide (NO), is in the chamber. If oxygen is used to treat the remote plasma nitrided oxide layer 300 in the thermal annealing procedure in the chamber, the temperature of the chamber is about 600 to 1000° C. The best temperature of the chamber is about 1000° C. The pressure of the chamber is about 30 to 60 torrs. The best pressure of the chamber is about 50 torrs. The time for the thermal annealing procedure, which uses oxygen in the chamber to treat the remote plasma nitrided oxide layer 300, is about 10 to 20 seconds. The best processing time for the thermal annealing procedure is about 15 seconds. The flow rate of oxygen in the chamber is about 3 to 7 standard liters per minute (slm). The best flow rate of oxygen in the chamber is about 5 standard liters per minute.

If nitric monoxide is used to treat the remote plasma nitrided oxide layer 300 in the thermal annealing procedure, the temperature of the chamber is about 600 to 1000° C. The best temperature of the chamber is about 1000° C. The pressure of the chamber is about 30 to 60 torrs. The best pressure of the chamber is about 50 torrs. The time for the thermal annealing procedure, which uses nitric monoxide in the chamber to treat the remote plasma nitrided oxide layer 300, is about 10 to 20 seconds. The best processing time for the thermal annealing procedure is about 15 seconds. The flow rate of nitric monoxide in the chamber is about 1 to 5 standard liter per minute (slm). The best flow rate of nitric monoxide in the chamber is about 3 standard liters per minute.

Because the remote plasma nitrided oxide layer, without the thermal annealing treatment, has lower channel mobility, the device has worse performance if this kind of remote plasma nitrided oxide layer is used as the gate dielectric.

On the other hand, the remote plasma nitrided oxide layer with the thermal annealing treatment has higher channel mobility. Therefore, the use of the remote plasma nitrided oxide layer as the gate dielectric layer can significantly improve the device performance.

If the remote plasma nitrided oxide layer, without thermal annealing treatment is used as the gate dielectric layer, the gate dielectric/Si-substrate interface is less smooth because of the nature of the remote plasma nitridation procedure, which degrades the device reliability and performance. However, a smooth interface can be obtained by the thermal annealing treatment, significantly improve the device reliability and performance.

The remote plasma nitrided oxide layer generally uses the wet oxidation procedure to form the in-situ steam generation layer on the substrate as the starting layer. Then the remote plasma nitridation procedure is applied to treat the in-situ steam generation layer to become the remote plasma nitrided oxide layer as the gate dielectric layer. The device reliability and performance can be significantly improved by the present invention. The present invention adds a thermal annealing procedure and the base oxide layer can be formed using any kind of dry or wet oxidation method, dependent on the needs and requirements. Then the remote plasma nitridation procedure and the thermal annealing procedure are applied to form the remote plasma nitrided oxide layer. Using the method of the present invention can also increase the production efficiency.

Figure 8:
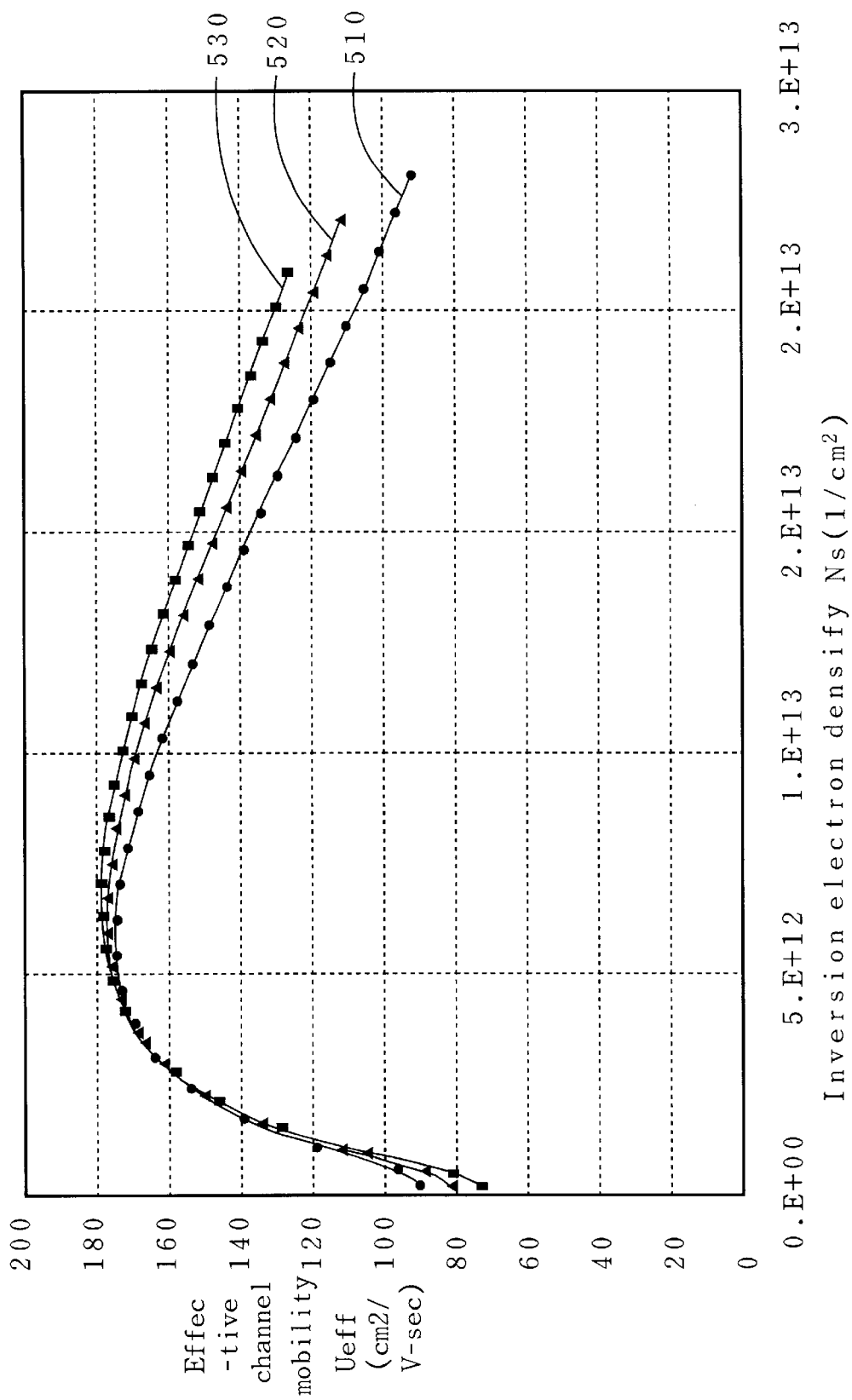
FIG. 8 shows a diagram for comparing the performances of the gate dielectric layers, which are formed using three different kinds of procedures.

FIG. 8 shows a diagram in comparing the channel mobility for three different gate dielectric layers. Three different kinds of procedures are used to treat a 12-angstrom base oxide layer. The temperature of the remote plasma nitridation procedure in three different kinds of procedures is about 500° C. The first curve line 510 is the data for the gate dielectric layer formed by the remote plasma nitridation procedure at 500° C. without thermal annealing treatment. The second curve line 520 is the data for the gate dielectric layer formed by the remote plasma nitridation procedure at 500° C. with thermal annealing treatment in oxygen ambient. The third curve line 530 is the data for the gate dielectric layer formed by the remote plasma nitridation procedure at 500° C. with thermal annealing treatment in nitric monoxide ambient.

From FIG. 8, the third curve line 530 has the best channel mobility and the first curve line 510 has the lowest channel mobility.

Therefore, when the remote plasma nitrided oxide layer is used to be the gate dielectric layer, using the method of the present invention to treat the remote plasma nitrided oxide layer by using the thermal annealing procedure can increase the performance and the reliability of the gate dielectric layer. In the thermal annealing procedure, using the nitric monoxide environment to treat the remote plasma nitrided oxide layer can get higher performance and better reliability of the gate dielectric layer than using the oxygen environment to treat the remote plasma nitrided oxide layer. Therefore, when the remote plasma nitrided oxide layer is used as the gate dielectric layer, using the nitric monoxide annealing to treat the remote plasma nitrided oxide layer in the thermal annealing procedure can get the best results.

The present invention, the present invention provides a method for forming better qualities of the gate dielectric layer by using a remote plasma nitridation procedure and a thermal annealing procedure in turn to treat the oxide layer to be used as the gate dielectric layer. The first step of the present invention is to form a base oxide layer on a substrate of a wafer. The base oxide layer can be formed using any kind of method. Then nitrogen ions are introduced into the base oxide layer by using the remote plasma nitridation procedure to form a remote plasma nitrided oxide layer. Then, thermal annealing in oxygen ($O_2$) or nitric monoxide (NO) ambient is used to treat the remote plasma nitrided oxide layer to increase the channel mobility and the performance of the gate dielectric layer of the present invention. The present invention can also increase the reliability of the gate dielectric layer and to increase the qualities of the semiconductor elements. The present invention can further increase the production efficiency of the semiconductor procedure.

Although specific embodiments have been illustrated and described, it will be obvious to those skilled in the art that various modifications may be made without departing from what is intended to be limited solely by the appended claims.

What is claimed is:

1. A method for forming a gate dielectric layer, said method comprises:

providing a wafer, wherein said wafer comprises a substrate;

forming a base oxide layer on said substrate;

placing said wafer in a first chamber to proceed a remote plasma nitridation procedure to introduce a nitrogen ion into said base oxide layer, wherein said first chamber comprises a nitrogen and a carrier gas; and placing said wafer in a second reaction chamber to proceed a thermal annealing procedure, wherein said second chamber only contains an oxygen.

2. The method according to claim 1, wherein said carrier gas is a helium.

3. The method according to claim 1, wherein a flow rate of said oxygen is about 3 to 7 standard liter per minute.

4. The method according to claim 1, wherein a temperature of said thermal annealing procedure is about 600 to 1000° C.

5. The method according to claim 1, wherein a pressure of said thermal annealing procedure is about 30 to 60 torrs.

6. The method according to claim 1, wherein a processing time of said thermal annealing procedure is about 10 to 20 seconds.

7. The method according to claim 1, wherein a processing time of said remote plasma nitridation procedure is about 40 to 120 seconds.

8. The method according to claim 1, wherein a temperature of said remote plasma nitridation procedure is about 450 to 900° C.

9. The method according to claim 1, wherein a pressure of said remote plasma nitridation procedure is about 1 to 2.2 torrs.

* * * * *